US008953317B2

(12) United States Patent
Campbell et al.

(10) Patent No.: US 8,953,317 B2
(45) Date of Patent: Feb. 10, 2015

(54) WICKING VAPOR-CONDENSER FACILITATING IMMERSION-COOLING OF ELECTRONIC COMPONENT(S)

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 13/281,669

(22) Filed: Oct. 26, 2011

(65) Prior Publication Data
US 2013/0105122 A1     May 2, 2013

(51) Int. Cl.
*H02B 1/00* (2006.01)
*H02B 1/56* (2006.01)
(Continued)

(52) U.S. Cl.
CPC .......... *F28D 1/0477* (2013.01); *F28D 15/0266* (2013.01); *F28D 15/0275* (2013.01); *H05K 7/203* (2013.01); *H05K 7/20809* (2013.01)
USPC ........... 361/699; 361/676; 361/677; 361/688; 361/689; 361/700; 361/701; 361/702; 361/703; 361/704; 361/705; 361/706; 361/707; 361/708; 361/709; 361/710; 361/711; 361/712; 361/713; 361/714; 165/80.4; 165/80.5; 165/104.33; 257/714; 257/715; 174/15.2

(58) Field of Classification Search
CPC ....... H05K 7/20; H05K 7/2029; H05K 7/203; H05K 7/20309; H05K 7/20336; H05K 7/20663; H05K 7/208; F28D 15/00; F28D 15/02; F28D 15/04; F28D 15/043; F28D 15/046

USPC ......... 361/688, 689, 699, 700–714, 676, 677, 361/831; 165/80.4–80.5, 104.33; 257/714, 257/715; 174/15.2
See application file for complete search history.

(56) References Cited

U.S. PATENT DOCUMENTS 2,218,407 A    10/1940  Meyerhoefer
2,983,115 A     5/1961  Caswell
(Continued)

OTHER PUBLICATIONS

Campbell et al., "Liquid-Cooled Electronics Rack with Immersion-Cooled Electronic Subsystems and Vertically-Mounted, Vapor-Condensing Unit", U.S. Appl. No. 12/825,745, filed Jun. 29, 2010.
(Continued)

*Primary Examiner* — Anthony Haughton
*Assistant Examiner* — Zhengfu Feng
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses and methods are provided for immersion-cooling one or more electronic components. The cooling apparatus includes a housing at least partially surrounding and forming a fluid-tight compartment about the electronic component(s) and a dielectric fluid disposed within the fluid-tight compartment, with the electronic component(s) immersed within the dielectric fluid. A vapor-condenser and one or more wicking components are also provided. The vapor-condenser includes a plurality of thermally conductive condenser fins extending within the fluid-tight compartment, and the wicking component(s) is disposed within the fluid-tight compartment in physical contact with at least a portion of one or more thermally conductive condenser fins of the thermally conductive condenser fins extending within the compartment. The wicking component(s) facilitates drawing condensed fluid from a surface of the thermally conductive condenser fin(s) and thereby enhances heat transfer across the surface of the condenser fin(s).

18 Claims, 16 Drawing Sheets

(51) Int. Cl.
*H05K 7/20* (2006.01)
*F28F 7/00* (2006.01)
*F28D 15/00* (2006.01)
*H01L 23/12* (2006.01)
*H01L 23/34* (2006.01)
*H01B 7/42* (2006.01)
*F28D 1/047* (2006.01)
*F28D 15/02* (2006.01)

(56) References Cited

U.S. PATENT DOCUMENTS

| | | | |
|---|---|---|---|
| 4,012,770 A | 3/1977 | Pravda et al. | |
| 4,285,395 A | 8/1981 | Masutani et al. | |
| 4,548,262 A | 10/1985 | Hull | |
| 4,833,567 A * | 5/1989 | Saaski et al. | 361/700 |
| 5,216,580 A * | 6/1993 | Davidson et al. | 361/700 |
| 7,134,485 B2 | 11/2006 | Hul-Chun | |
| 7,885,070 B2 | 2/2011 | Campbell et al. | |
| 7,916,483 B2 | 3/2011 | Campbell et al. | |
| 7,927,394 B2 | 4/2011 | MacKenzie et al. | |
| 7,936,560 B2 | 5/2011 | Toyoda et al. | |
| 7,944,694 B2 | 5/2011 | Campbell et al. | |
| 7,961,475 B2 | 6/2011 | Campbell et al. | |
| 7,983,040 B2 | 7/2011 | Campbell et al. | |
| 2011/0103019 A1 | 5/2011 | Campbell et al. | |

OTHER PUBLICATIONS

Campbell et al., "Immersion-Cooling Apparatus and Method for an Electronic Subsystem of an Electronics Rack", U.S. Appl. No. 12/825,756, filed Jun. 29, 2010.

Campbell et al., "Interleaved, Immersion-Cooling Apparatus and Method for an Electronic Subsystem of an Electronics Rack", U.S. Appl. No. 12/825,761, filed Jun. 29, 2010.

Campbell et al., "Interleaved, Immersion-Cooling Apparatuses and Methods for Cooling Electronic Subsystems", U.S. Appl. No. 12/825,776, filed Jun. 29, 2010.

Campbell et al., "Liquid-Cooled Electronics Rack with Immersion-Cooled Electronic Subsystems", U.S. Appl. No. 12/825,781, filed Jun. 29, 2010.

Satish G. Kandikar et al., "Handbook of Phase Change: Boiling and Condensation", Taylor & Francis, Philadelphia, PA, Jun. 1, 1999 (pp. 614-615).

* cited by examiner

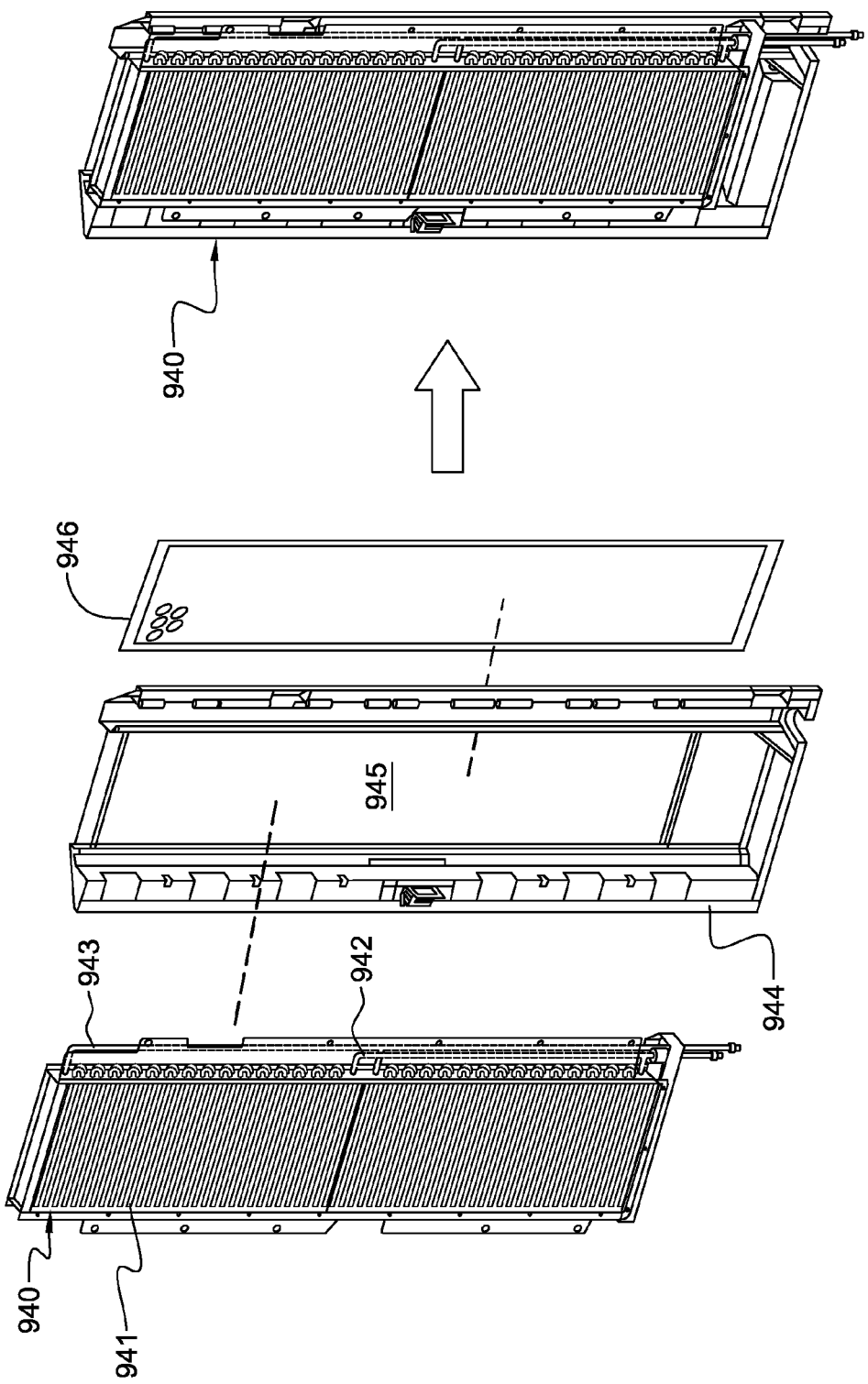

WICKING VAPOR-CONDENSER FACILITATING IMMERSION-COOLING OF ELECTRONIC COMPONENT(S)

BACKGROUND

The power dissipation of integrated circuit chips, and the modules containing the chips, continues to increase in order to achieve increases in processor performance. This trend poses cooling challenges at the module, subsystem and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided through the provision of a cooling apparatus comprising a housing configured to at least partially surround and form a fluid-tight compartment about at least one electronic component to be cooled. A fluid is disposed within the fluid-tight compartment and the at least one electronic component to be cooled is immersed within the fluid. The cooling apparatus further includes a vapor-condenser and at least one wicking component. The vapor-condenser includes a plurality of thermally conductive condenser fins which extend within the fluid-tight compartment in a vapor region of the fluid-tight compartment, and the at least one wicking component is disposed within the vapor region of the fluid-tight compartment and in physical contact with at least a portion of at least one thermally conductive condenser fin of the plurality of thermally conductive condenser fins extending within the fluid-tight compartment. The at least one wicking component facilitates drawing condensed fluid from at least one surface of the at least one thermally conductive condenser fin and thereby enhancing heat transfer across the at least one surface of the at least one thermally conductive condenser fin.

In another aspect, a liquid-cooled electronic system is provided which includes an electronics rack comprising at least one electronic component to be cooled, and a cooling apparatus immersion-cooling the at least one electronic component. The cooling apparatus includes a housing at least partially surrounding and forming a fluid-tight compartment about the at least one electronic component, and a fluid disposed within the fluid-tight compartment. The at least one electronic component is immersed within the fluid. The cooling apparatus further includes a vapor-condenser, and at least one wicking component. The vapor-condenser includes a plurality of thermally conductive condenser fins which extend within the fluid-tight compartment in a vapor region of the fluid-tight compartment, and the at least one wicking component is disposed within the vapor region of the fluid-tight compartment and in physical contact with at least a portion of at least one thermally conductive condenser fin of the plurality of thermally conductive condenser fins extending within the fluid-tight compartment. The at least one wicking component facilitates drawing condensed fluid from the at least one surface of the at least one thermally conductive condenser fin and thereby enhancing heat transfer across the at least one surface of the at least one thermally conductive condenser fin.

In a further aspect, a method of facilitating cooling of at least one electronic component is provided. The method includes: providing a housing at least partially surrounding and forming a fluid-tight compartment about the at least one electronic component to be cooled; immersing the at least one electronic component within a dielectric fluid within the fluid-tight compartment; providing a vapor-condenser comprising a plurality of thermally conductive condenser fins extending into the fluid-tight compartment in a vapor region of the fluid-tight compartment; and providing at least one wicking component disposed within the vapor region of the fluid-tight compartment and in physical contact with at least a portion of the at least one thermally conductive condenser fin of the plurality of thermally conductive condenser fins extending within the fluid-tight compartment, the at least one wicking component facilitating drawing condensed fluid from the at least one surface of the at least one thermally conductive condenser fin and thereby enhancing heat transfer across the at least one surface of the at least one thermally conductive condenser fin.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 9C is a partially exploded view of one embodiment of an air-to-liquid heat exchanger mounted in a rack door, which includes a heat exchanger coil and inlet and outlet plenums of the heat exchange system, for use (for example) in an electronics rack such as depicted in FIG. 9A, in accordance with one or more aspects of the present invention;

DETAILED DESCRIPTION

Figure 1:
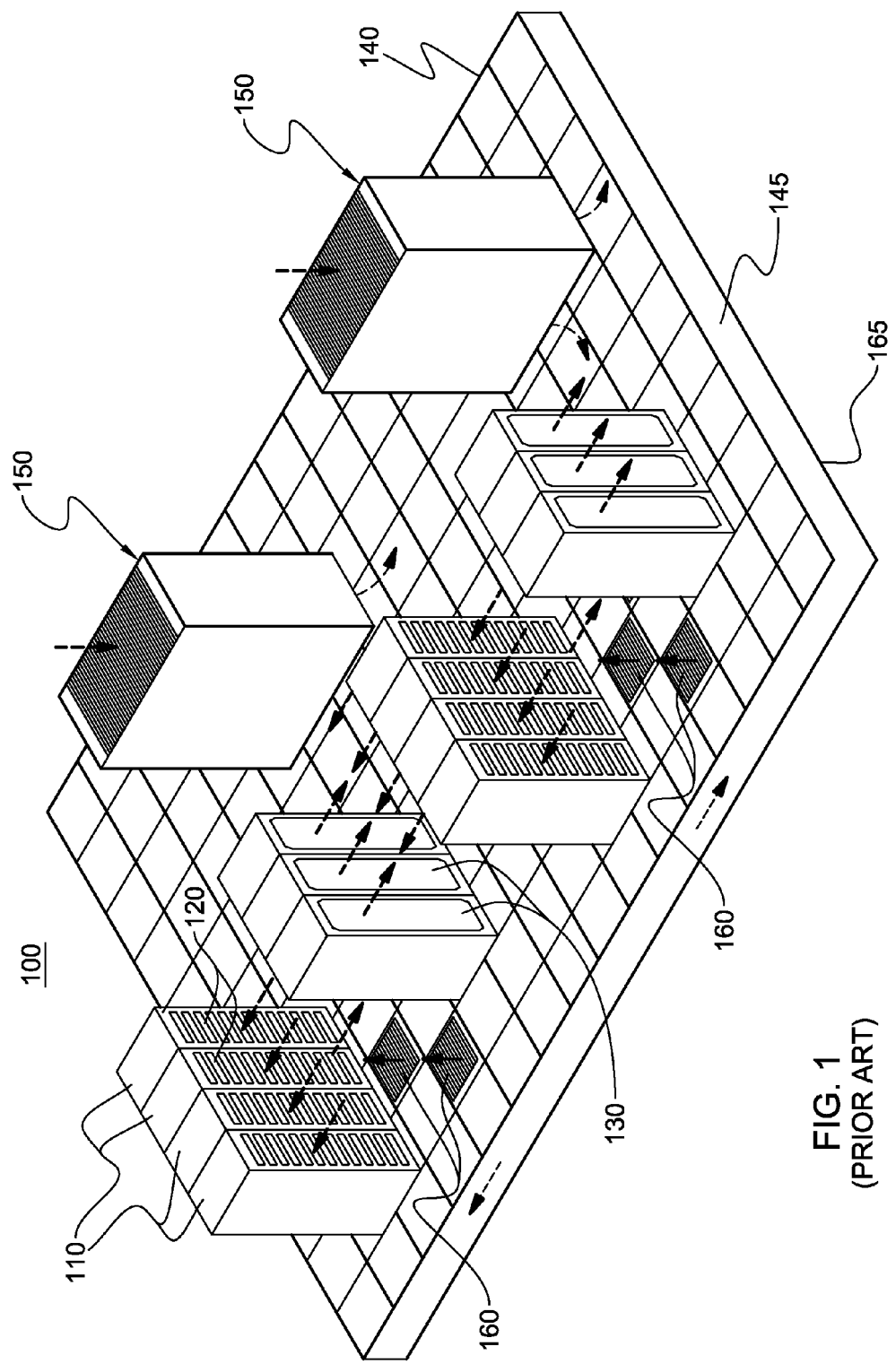
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise one or more electronic subsystems. "Electronic subsystem" refers to any sub-housing, blade, book, drawer, node, compartment, board, etc., having one or more heat-generating electronic components disposed therein or thereon. An electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system which comprises multiple different types of electronic components, and may be, in one example, a server unit.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled base plate", or "liquid-cooled structure" each refer to any conventional thermally conductive structure having a plurality of channels or passageways formed therein for flowing of liquid-coolant therethrough.

As used herein, an "air-to-liquid heat exchanger" means any heat exchange mechanism characterized as described herein, across which air passes and through which liquid coolant can circulate; and includes, one or more discrete air-to-liquid heat exchangers, coupled either in series or in parallel. An air-to-liquid heat exchanger may comprise, for example, one or more coolant flow paths, formed of thermally conductive tubing (such as copper or other tubing) thermally and mechanically coupled to a plurality of fins across which air passes. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
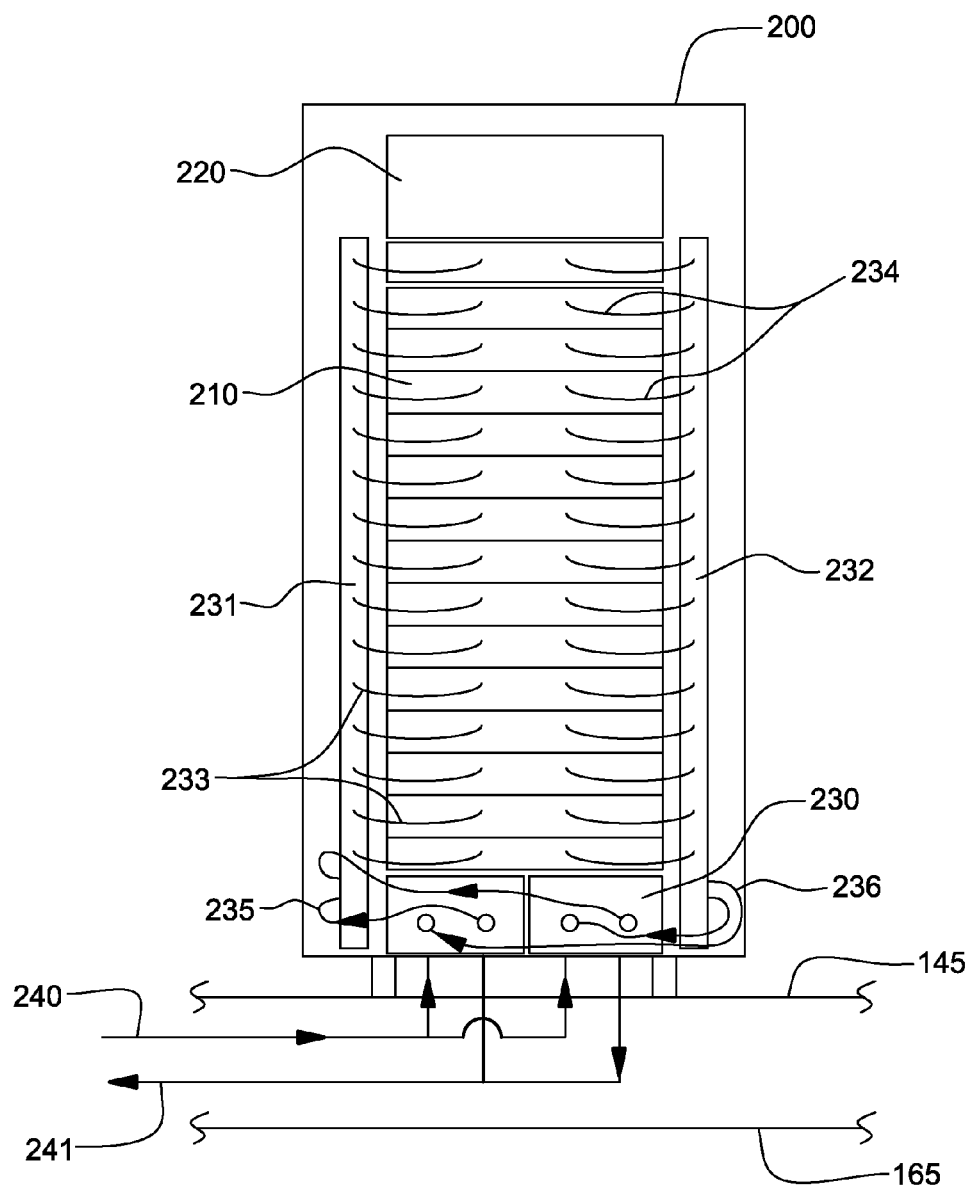
FIG. 2 is a front elevational view of one embodiment of a liquid-cooled electronics rack comprising multiple electronic subsystems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic subsystems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic subsystems. In the embodiments described herein, the system coolant is assumed to be water or an aqueous-based solution, by way of example only.

In addition to MCUs 230, the cooling apparatus includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (see FIGS. 6A-7A & 7D-9) disposed within the subsystems) and node-to-manifold fluid connect hoses 234 coupling the individual electronic subsystems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic subsystems is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
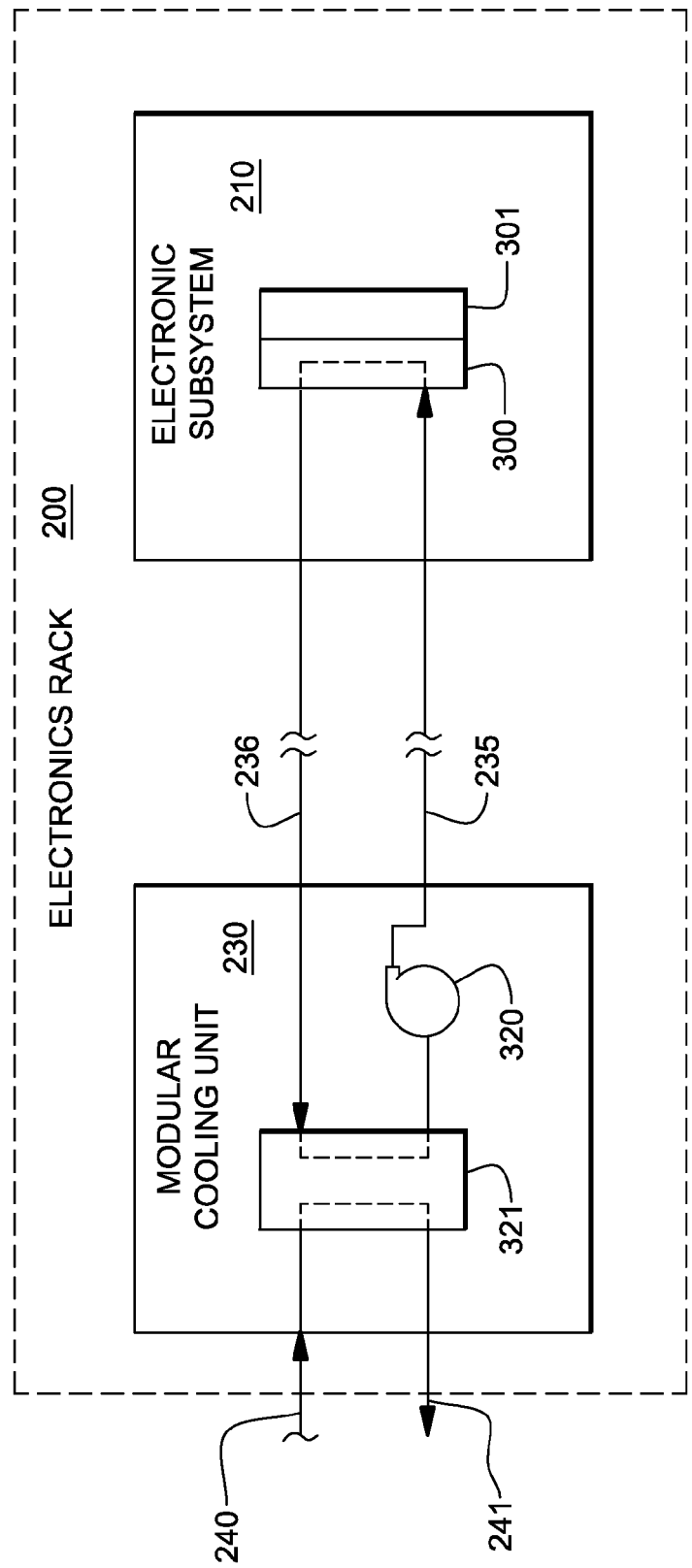
FIG. 3 is a schematic of an electronic subsystem of an electronics rack and one approach to liquid-cooling of an electronic component with the electronic subsystem, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic subsystem 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic subsystems. Furthermore, the system coolant is physically separate from the less controlled facility coolant in lines 240, 241, to which heat is ultimately transferred.

Figure 4:
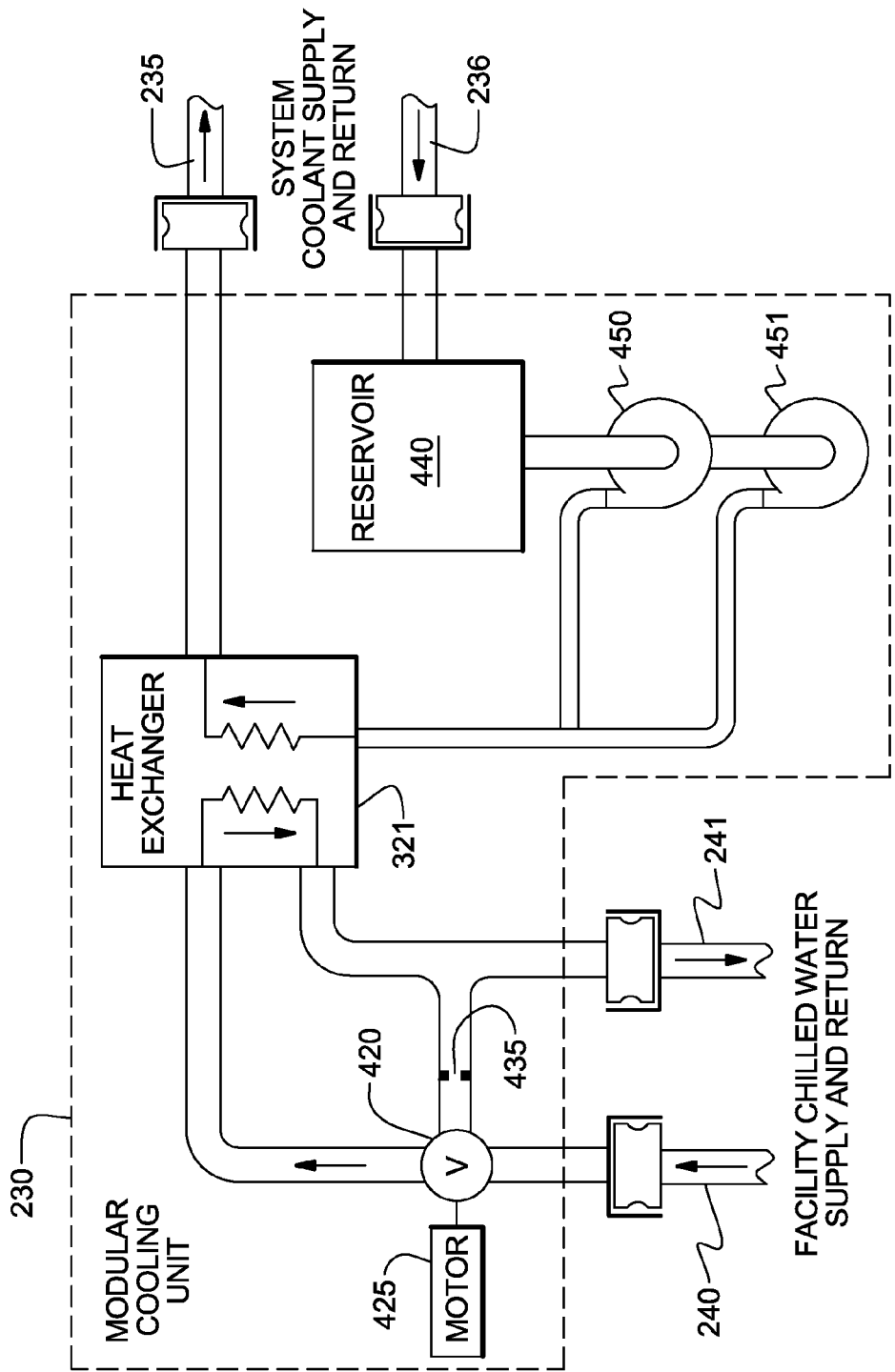
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
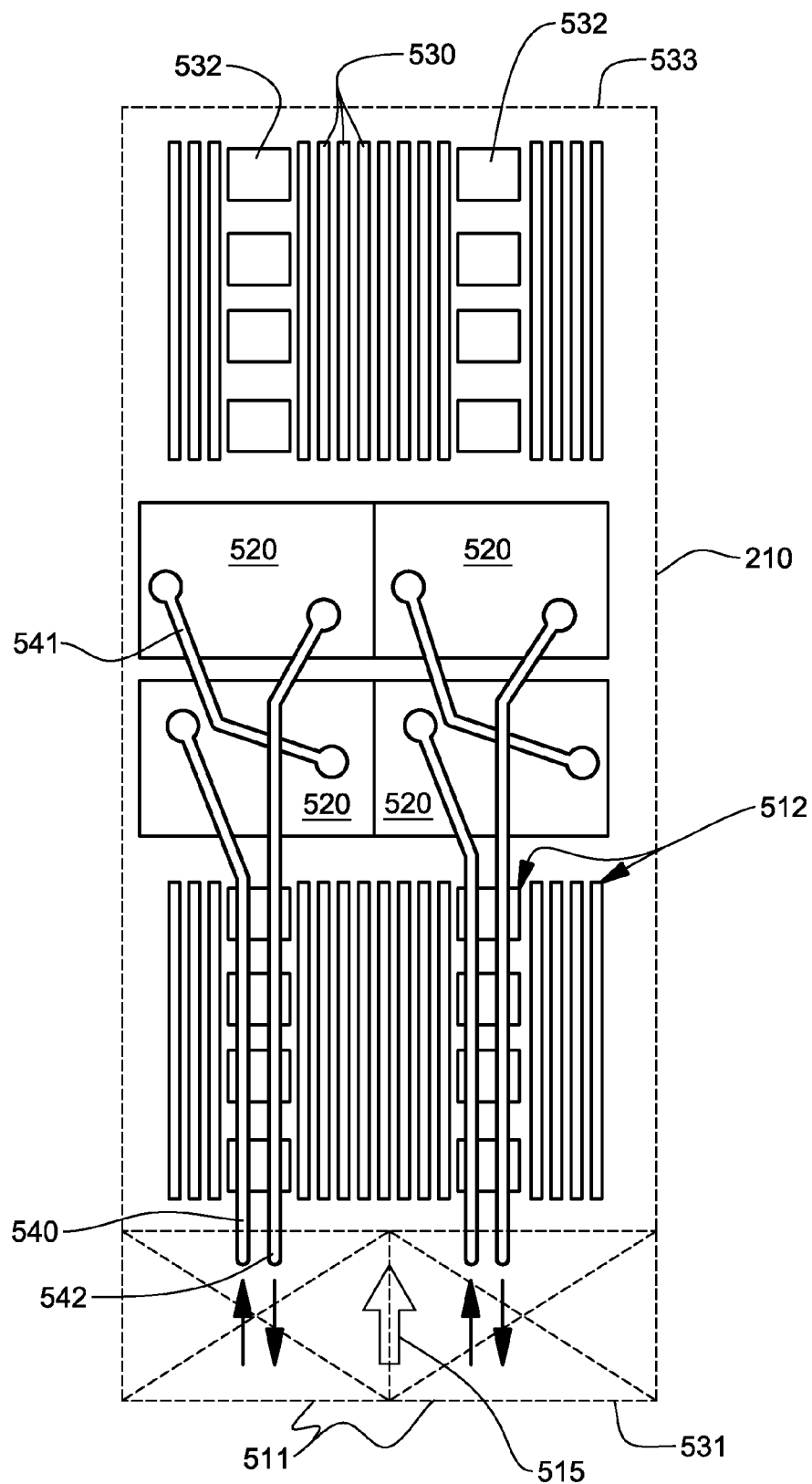
FIG. 5 is a plan view of one embodiment of an electronic subsystem layout illustrating an air and liquid-cooling approach for cooling electronic components of the electronic subsystem, in accordance with one or more aspects of the present invention.

FIG. 5 depicts another cooling approach, illustrating one embodiment of an electronic subsystem 210 component layout wherein one or more air moving devices 511 provide forced air flow 515 in normal operating mode to cool multiple electronic components 512 within electronic subsystem 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic subsystem 210, and partially arrayed near back 533 of electronic subsystem 210. Also, in the embodiment of FIG. 5, memory modules 530 and the memory support modules 532 are cooled by air flow 515 across the electronics subsystem.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As packaging density of modern electronics increases, heat dissipation for servers and server components becomes increasingly challenging. Electronic components must be cooled to function properly, and the service life of these components increases with lower temperature operation. New technologies, such as stacked die (3D modules) and solid state drives (SSDs) significantly increase the number of components and circuits, and thus the volumetric heat generation within electronics racks, servers, personal computers, and hand-held devices, such as smart phones. The structures disclosed herein address this increased volumetric dissipation of heat, while maintaining reliability through novel cooling arrangements.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic subsystem using pumped liquid, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, all components to be cooled are immersed in a dielectric fluid that dissipates heat through boiling. The vapor is then condensed by a secondary, rack-level working fluid using node or module-level, finned condensers, as explained below. A secondary fluid can then tolerate a larger temperature rise, thus requiring a smaller flow rate and/or higher inlet temperatures, improving energy efficiency.

Direct immersion-cooling of electronic components of an electronic subsystem of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 3 & 5, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic subsystems of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
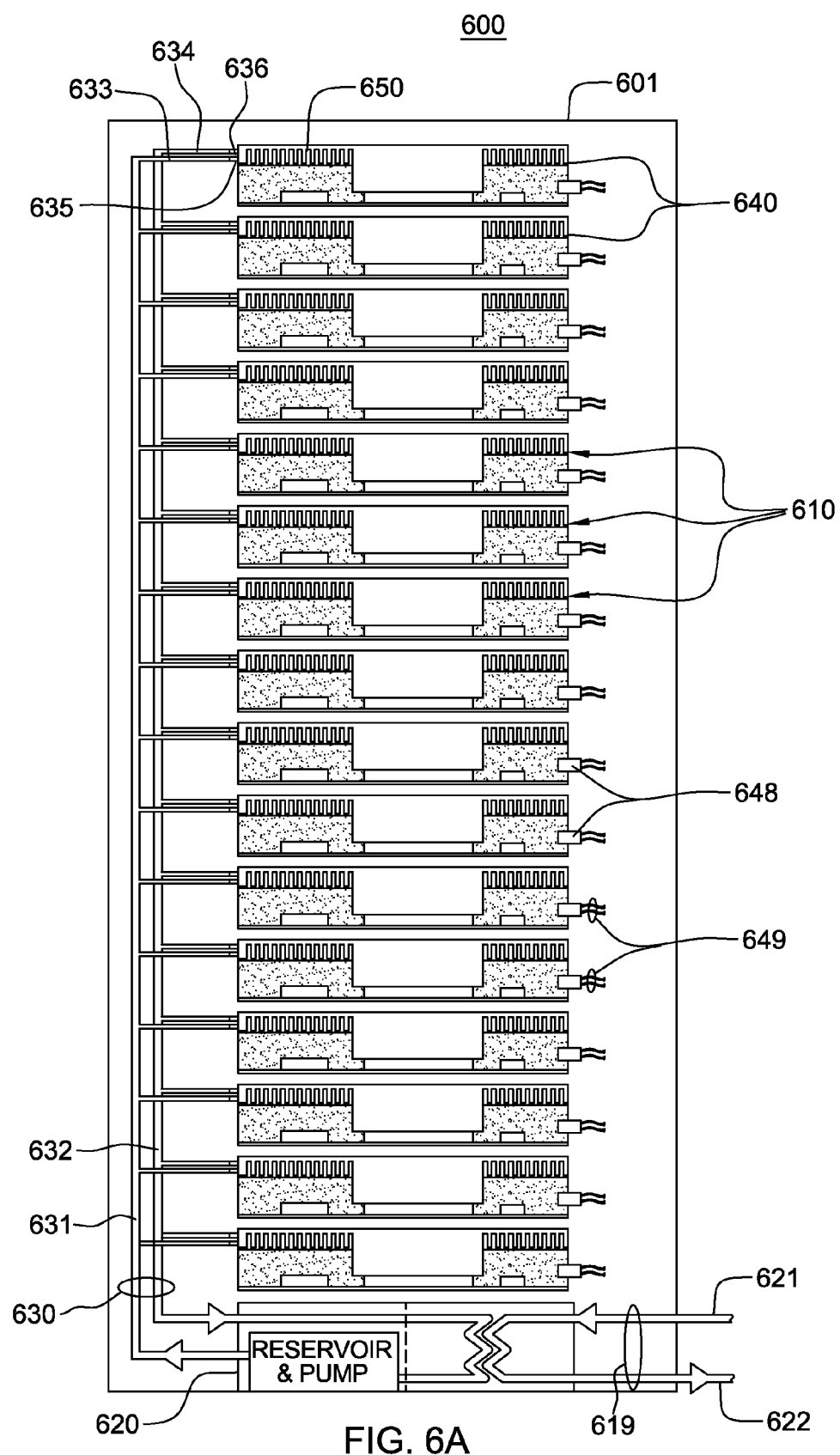
FIG. 6A is an elevational view of an alternate embodiment of a liquid-cooled electronics rack with immersion-cooling of electronic subsystems thereof, in accordance with one or more aspects of the present invention.

FIG. 6A is a schematic of one embodiment of a liquid-cooled electronics rack, generally denoted 600, employing immersion-cooling of electronic subsystems, in accordance with an aspect of the present invention. As shown, liquid-cooled electronics rack 600 includes an electronics rack 601 containing a plurality of electronic subsystems 610 disposed, in the illustrated embodiment, horizontally so as to be stacked within the rack. By way of example, each electronic subsystem 610 may be a server unit of a rack-mounted plurality of server units. In addition, each electronic subsystem includes multiple electronic components to be cooled, which in one embodiment, comprise multiple different types of electronic components having different heights and/or shapes within the electronic subsystem.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic subsystems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic subsystem 610 via the respective liquid-cooled vapor condenser 650 is transferred from the system coolant via the coolant outlet manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic subsystem disposed within the sealed housing when the electronic subsystem is operatively positioned within the sealed housing and the sealed housing is operatively positioned within the electronics rack.

Figure 6B:
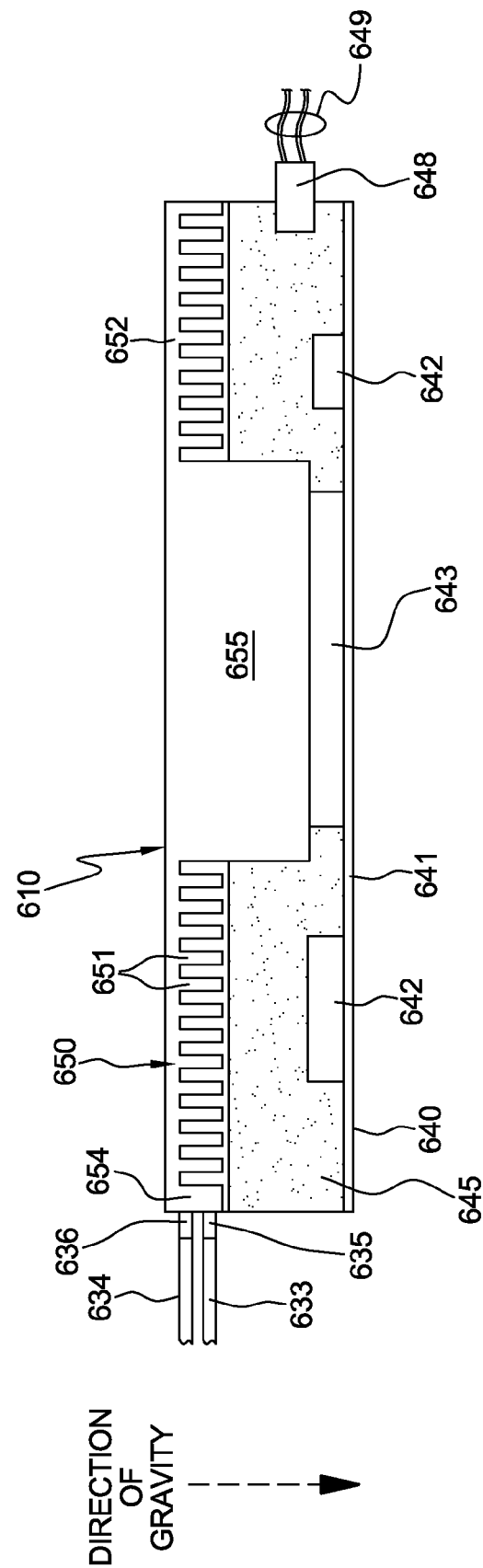
FIG. 6B is a cross-sectional elevational view of one immersion-cooled electronic subsystem of the liquid-cooled electronics rack of FIG. 6A, in accordance with one or more aspects of the present invention.

As illustrated in FIG. 6B, electronic subsystem 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic subsystem with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651, 655 extending therefrom in the upper portion of the sealed compartment. A plenum structure 654 comprises part of liquid-cooled base plate 652, and facilitates passage of system coolant through one or more channels (not shown) in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cool condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

Two-phase immersion-cooling of one or more electronic components can be limited by performance of the vapor-condenser. Poor condenser performance may result in an increased amount of vapor within the fluid-tight compartment, raising the pressure in the immersion-cooling enclosure and potentially (detrimentally) raising the saturation temperature. Disclosed hereinbelow are various cooling apparatuses and methods of cooling which enhance condensation performance by removing or drawing condensing liquid film away from one or more heat transfer surfaces of one or more thermally conductive fins of the vapor-condenser using porous wicking components to draw the liquid, and accumulate the liquid condensate, which then allow the condensate to drip therefrom in the direction of gravity.

Generally stated, provided herein are various embodiments of cooling apparatuses which include a housing at least partially surrounding and forming a fluid-tight compartment about at least one electronic component to be cooled, and a dielectric fluid disposed within the fluid-tight compartment. The at least one electronic component to be cooled is immersed within the dielectric fluid. The cooling apparatus further includes a vapor-condenser and one or more wicking components, both of which are at least partially disposed in a vapor region of the fluid-tight compartment. The vapor-condenser includes a plurality of thermally conductive condenser fins extending within the fluid-tight compartment, and the one or more wicking components are in physical contact with at least a portion of one or more thermally conductive condenser fins of the plurality of thermally conductive condenser fins. The one or more wicking components facilitate drawing of condensed fluid from one or more surfaces of the at least one thermally conductive condenser fin and thereby enhancing heat transfer across the one or more surfaces of the at last one thermally conductive condenser fin.

More particularly, disclosed herein are cooling apparatuses that dissipate heat generated by electronic components to be cooled through the use of a fluid (e.g., a dielectric fluid) and a vapor-condenser which facilitates heat transfer to a secondary fluid stream, whether air or liquid. In one implementation, the cooling apparatus includes one or more electronic components to be cooled mounted within a fluid-tight (or sealed) enclosure that is at least partially filled with dielectric coolant. The dielectric coolant transports heat from the electronic component(s) via boiling and condensation to a cooling structure (herein referred to as the vapor-condenser) extending within the fluid-tight compartment. The vapor-condenser includes fins extending within the fluid-tight compartment that are air-cooled and/or liquid-cooled. The dielectric vapor produced within the fluid-tight compartment rises to contact the thermally conductive condenser fins in a vapor region of the enclosure. The vapor condenses on the fins and creates a film that thickens along the edge of the film towards the edge (or tip) of the fin in the direction of gravity, where the liquid accumulates and drops back down due to gravity. In one embodiment disclosed hereinbelow, wicking components, such as porous strips, are periodically placed in physical contact with the fins (by, for example, attaching the strips to the fins), such that the liquid condensate that forms on the fins is drawn into the porous film or wicking component. This action thins the condensing liquid film on the fin surface(s), and improves the condensation heat transfer coefficient of the heat transfer surface of the fin. The liquid thus accumulates in the wicking component, away from the heat transfer surfaces, and once a sufficient amount of condensate has accumulated, drips back down into the liquid reservoir (i.e., the liquid region of the enclosure).

Figure 7A:
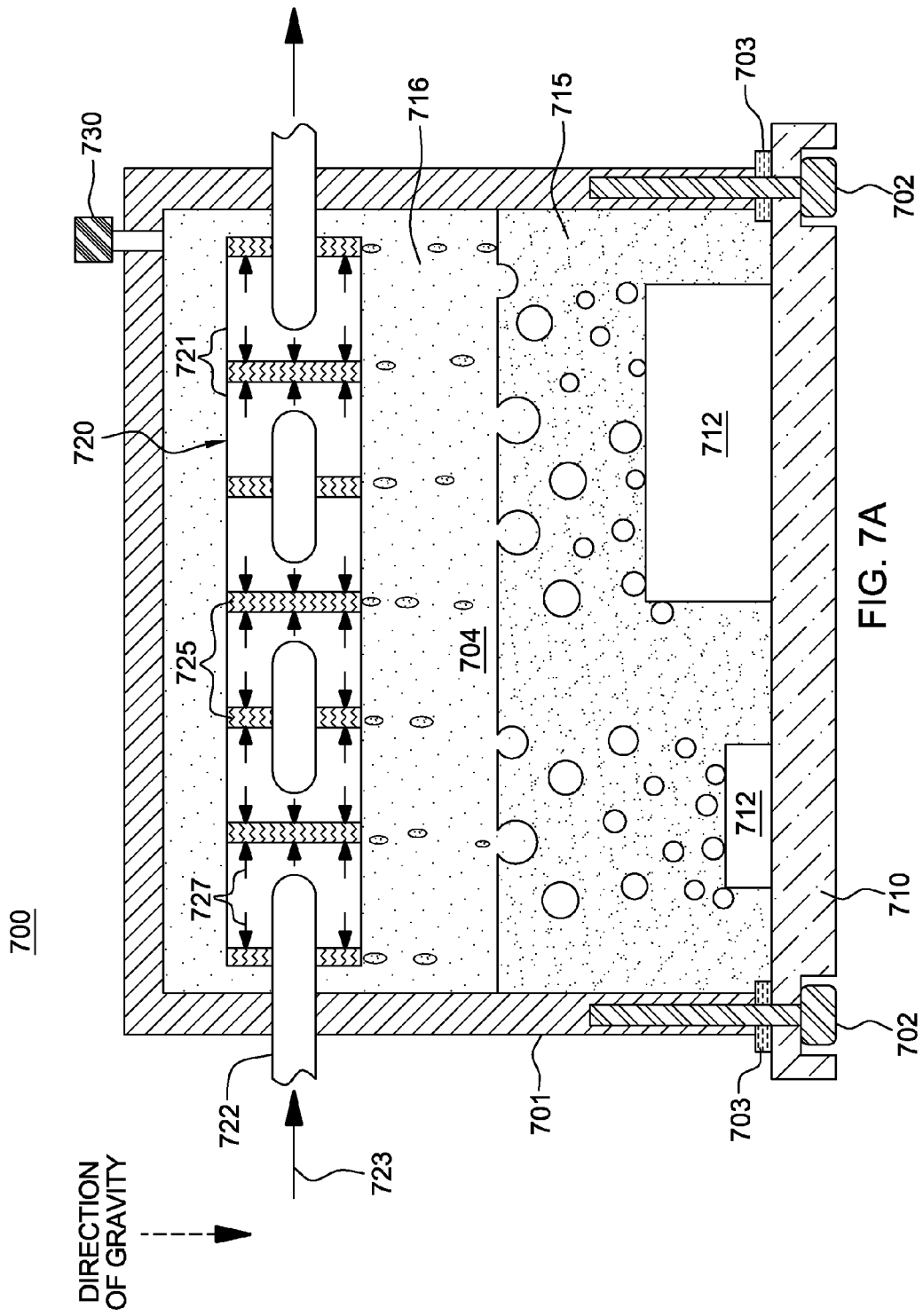
FIG. 7A is a cross-sectional elevational view of an alternate embodiment of an immersion-cooled electronic subsystem of, for example, a liquid-cooled electronics rack such as depicted in FIG. 6A, in accordance with one or more aspects of the present invention.

FIG. 7A is a cross-sectional elevational view of one embodiment of a cooling apparatus, generally denoted 700, in accordance with one or more aspects of the present invention. In one embodiment, cooling apparatus 700 may be configured to accommodate an electronic subsystem (or node) of an electronics rack, such as described above in connection with FIGS. 6A & 6B. In such an embodiment, a rack-level inlet manifold and rack-level outlet manifold would facilitate distribution of liquid coolant 723 among the vapor-condensers 720 associated with the electronic subsystems of the electronics rack. Further, depending upon the implementation, there may be a single cooling apparatus 700 within an electronic subsystem cooling, for example, substantially the entire electronic subsystem, or multiple such cooling apparatuses within the electronic subsystem, for example, to separately cool one or more high-heat-generating electronic components thereof.

Figure 7B:
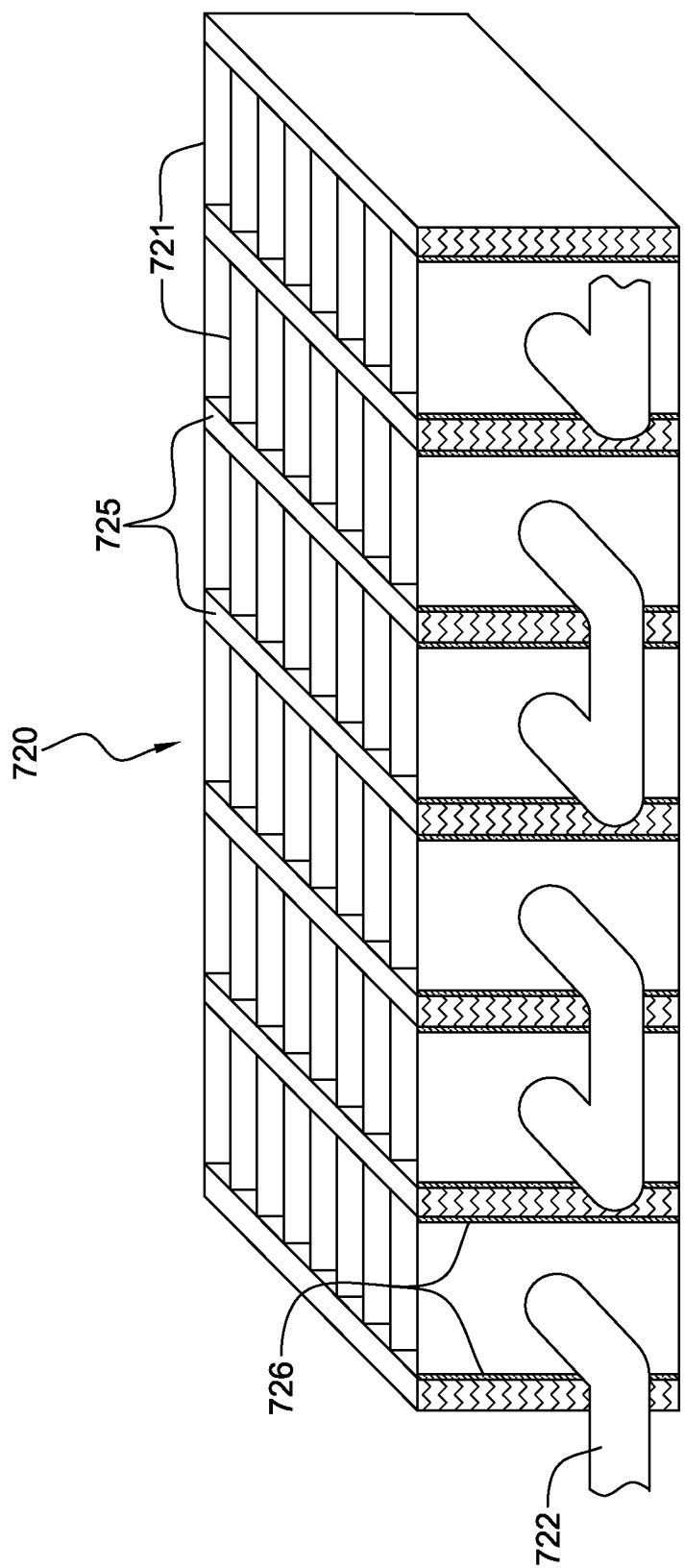
FIG. 7B depicts in greater detail one embodiment of the wicking vapor-condenser of the immersion-cooled electronic subsystem of FIG. 7A, in accordance with one or more aspects of the present invention.

As illustrated in FIG. 7A, cooling apparatus 700 includes a vapor-condenser 720 which functions as a heat sink, and in this embodiment, includes one or more coolant-carrying channels 722 through which liquid coolant 723 flows to facilitate extraction of heat from a plurality of thermally conductive condenser fins 721 of the vapor-condenser 720. Cooling apparatus 700 further includes an immersion-cooling enclosure 701 at least partially surrounding one or more electronic components 712, which in this example, mount to a substrate 710, such as a printed circuit board, to which immersion-cooling enclosure 701 is attached via, for example, attachment mechanisms 702 (e.g., screws) and gasket seals 703. Within immersion-cooling enclosure 701, a fluid-tight compartment 704 is defined which includes a dielectric coolant 715 that partially fills fluid-tight compartment 704. In the depicted embodiment, a portion of dielectric coolant 715 is illustrated in vapor-phase in an upper, vapor region 716 of fluid-tight compartment 704 where vapor-condenser 720 is disposed. As illustrated in FIG. 7B, vapor-condenser 720 includes (in this embodiment) the plurality of thermally conductive condenser fins 721, which are disposed substantially parallel to each other, through which the one or more coolant-carrying channels 722 pass.

Note that in the embodiment of FIG. 7A, multiple differently-sized electronic components 712 are illustrated by way of example only. The electronic components 712 to be cooled may comprise the same or different types of electronic components, and as one example, the immersion-cooling enclosure 701 may accommodate an entire electronic subsystem (or node) of an electronics rack, such as described above in connection with FIGS. 6A & 6B. A sealable fill port 730 may be provided in immersion-cooling enclosure 701 to facilitate immersing the one or more electronic components 712 within liquid dielectric coolant 715. That is, the fill port may be employed in filling the fluid-tight compartment with the degassed, electronics-compatible evaporator fluid, such as an FC or HFE-type fluid. The remaining space is evacuated such that non-condensables, such as air, are removed, and the enclosure is sealed to not allow air to leak back into the enclosure, or allow the evaporator fluid to be lost to the environment.

Cooling apparatus 700 further includes, in accordance with one or more aspects of the present invention, a plurality of wicking components 725, which are in physical contact with at least a portion of one or more of the thermally conductive condenser fins 721 of the plurality of thermally conductive condenser fins 721 extending within fluid-tight compartment 704. Wicking components 725 facilitate drawing condensed fluid 727 from one or more heat transfer surfaces of the thermally conductive condenser fin(s) 721, and thus enhance the heat transfer coefficient of the one or more surfaces. In one embodiment, wicking components 725 comprise porous strips that are spaced substantially parallel to each other and disposed substantially orthogonal to the parallel-extending, thermally conductive condenser fins 721. Fabrication of the wicking vapor-condenser 720 illustrated in FIGS. 7A & 7B may include press-fitting the wicking components 725 within appropriately-sized notches formed in the plurality of thermally conductive condenser fins 721, and/or by permanently attaching the wicking components to the fins using (for example) an epoxy or solder line 726 at the ends of the wicking components 725, as illustrated in FIG. 7B.

More particularly, the embodiment of FIGS. 7A & 7B illustrates one example of a liquid-cooled, fin and tube-type condenser, with embedded, orthogonally-extending porous strips (i.e., wicking components). The porous strips may be fabricated of porous metal (such as porous silver, porous copper, porous aluminum, or sintered copper), porous glass, porous ceramics (such as porous titania or zirconia), or porous polymer (such as porous polyethersulphone (PES) or nylon). By way of example, the porous strips (or wicking components) could comprise a copper foam, such as marketed by Metafoam, of Brossard, Quebec, Canada, or porous silver or porous nylon, both of which are available through Millipore, of Billerica, Mass., U.S.A. As noted, the porous strips may be press-fitted into periodic grooves (or notches) formed in the plurality of thermally conductive condenser fins. Epoxy or solder 726 can be used to bond the base and/or edges of the condenser to the porous material and hold the material in place. In the implementations presented herein, the wicking components are in physical contact with the thermally conductive condenser fins such that there are no gaps or obstructions (such as solder or epoxy) between the fin surfaces and the wicking components that would interfere with the wicking components effectively wicking liquid condensing on the surfaces of the fins. It is also beneficial to have the wicking components comprise thin strips in order to reduce the amount of condenser space consumed by the porous strips, which in the case of porous glass, ceramic or polymer, do not participate significantly in heat transfer.

Figure 8:
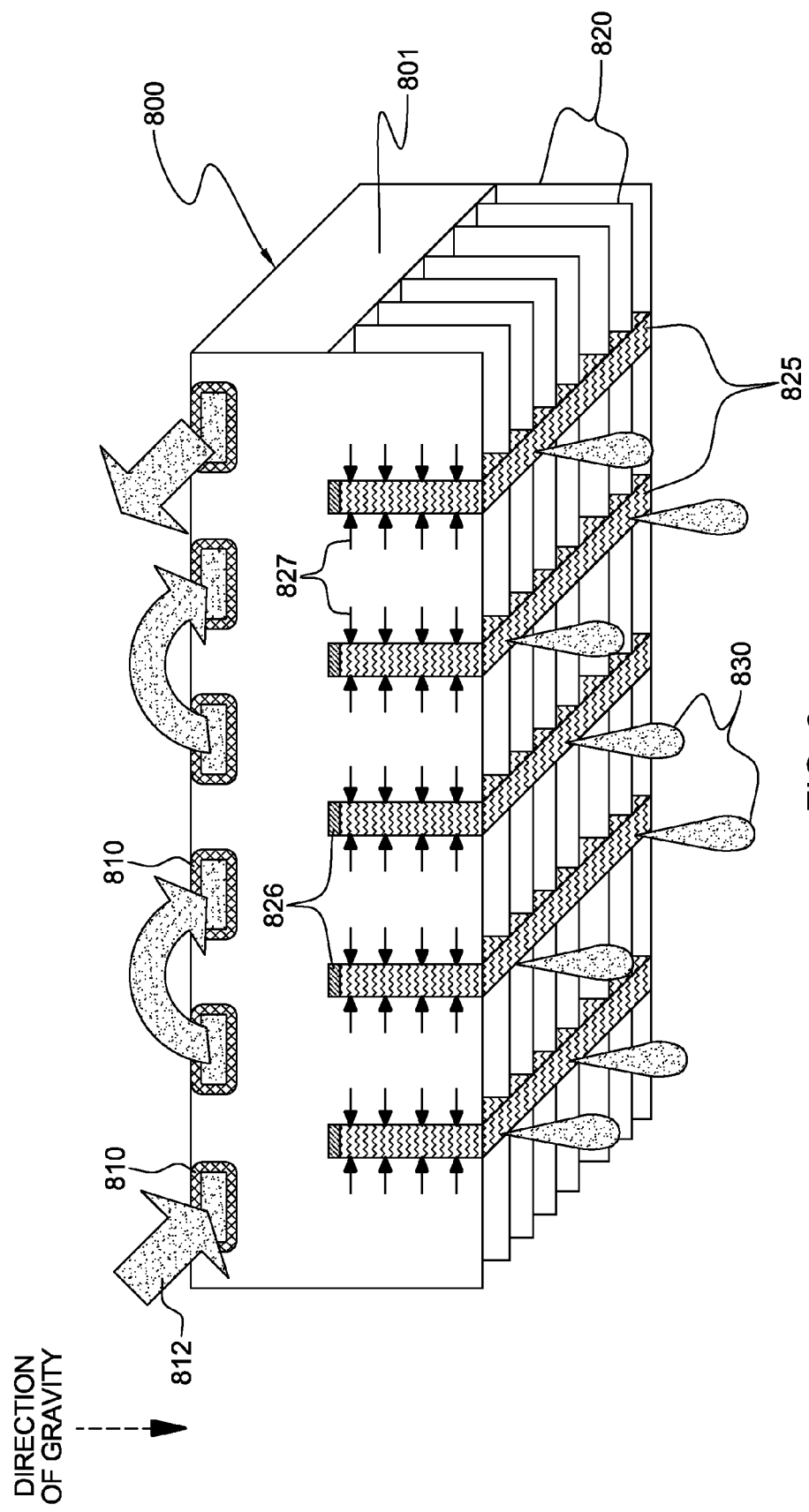
FIG. 8 depicts an alternate embodiment of a wicking vapor-condenser for an immersion-cooled electronic subsystem such as depicted in FIG. 7A, in accordance with one or more aspects of the present invention.

FIG. 8 depicts an alternate embodiment of a wicking vapor-condenser 800 of a cooling apparatus such as described above in connection with FIGS. 6A-7B. In this embodiment, wicking vapor-condenser 800 comprises a cold plate and fin-type condenser structure, wherein one or more coolant-carrying channels 810 facilitate the passage of liquid coolant 812 through the condenser. The condenser further includes a plurality of thermally conductive condenser fins 820 which, in use, depend within the fluid-tight compartment 704 (see FIG. 7A) of the immersion-cooling enclosure. In this embodiment, a plurality of wicking components 825 are disposed parallel to each other, and orthogonal to the plurality of thermally conductive condenser fins 820. An adhesive material 826 (such as epoxy or solder) may be employed to join the wicking components to, for example, a base 801 of wicking vapor-condenser 800. Fabrication of wicking vapor-condenser 800 may include machining the plurality of thermally conductive condenser fins 820 into base 801, and then forming a plurality of notches intersecting the fins and sized to accommodate the plurality of wicking components 825. The notches may be formed orthogonal to the plurality of thermally conductive condenser fins, as illustrated in FIG. 8, or at any intersecting angle which facilitates the physical contact of at least a portion of one or more thermally conductive condenser fins with the wicking component(s). In operation, the wicking components facilitate drawing condensed fluid 827 from the heat transfer surfaces of the plurality of thermally conductive condenser fins 820 for accumulation within the wicking component, and subsequent gravity-driven return as condensate 830 to the dielectric fluid 715 (see FIG. 7A).

Figure 9A:
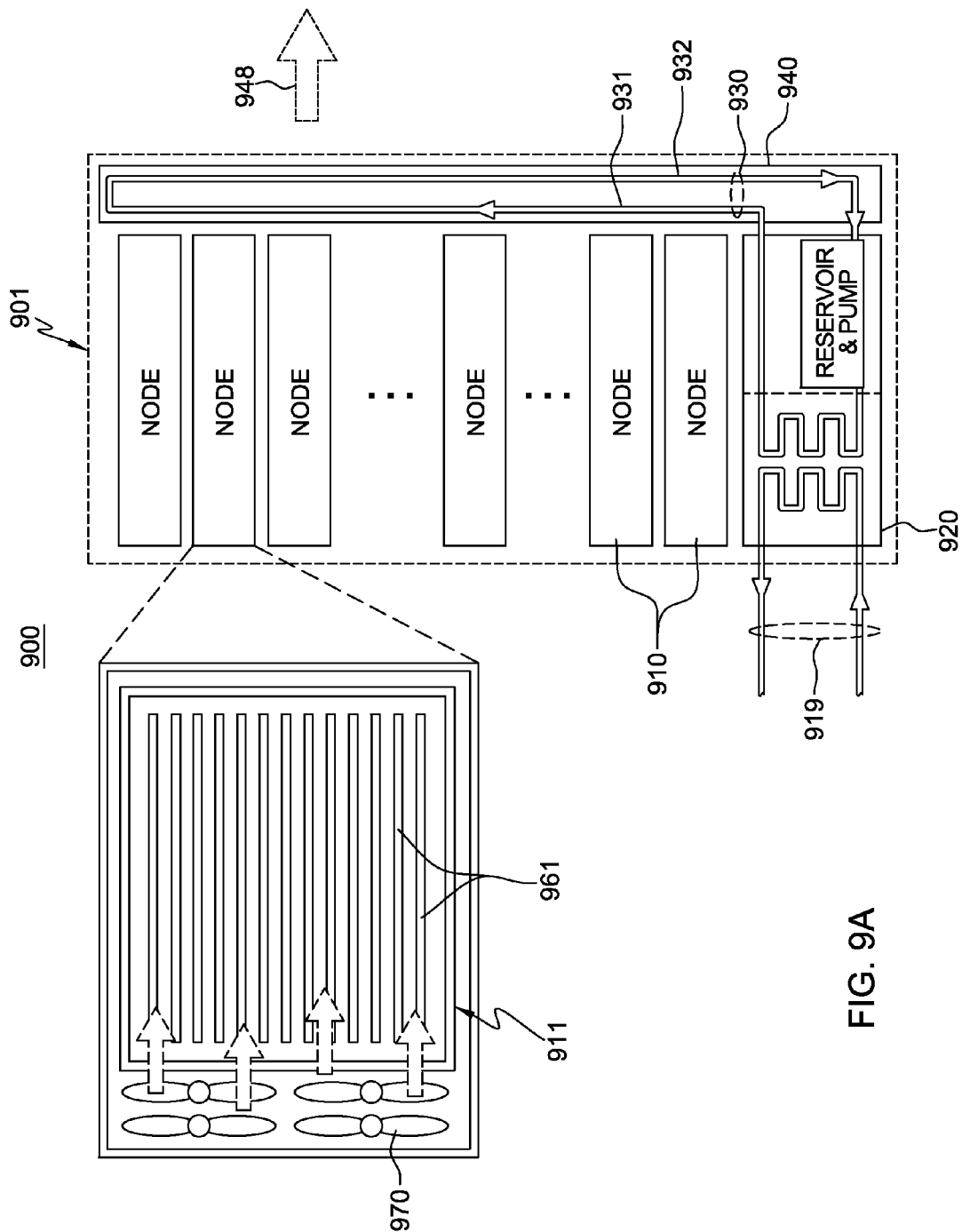
FIG. 9A in a schematic of one embodiment of a partially air-cooled electronics rack with immersion-cooling of one or more electronic subsystems thereof, in accordance with one or more aspects of the present invention.

FIG. 9A is a schematic of another embodiment of an electronic system 900 comprising a liquid-cooled electronics rack 901 with a plurality of immersion-cooled electronic subsystems 910 disposed, in the illustrated embodiment, horizontally, so as to be stacked within the rack. By way of example, each electronic subsystem 910 may be a server unit of a rack-mounted plurality of server units. In addition, each electronic subsystem may include multiple electronic components to be cooled, which in one embodiment, comprise multiple different types of electronic components having different heights and/or shapes within the electronic subsystem, disposed within an immersion-cooling enclosure 911.

The cooling apparatus is shown to include one or more modular cooling units (MCUs) 920 disposed, by way of example, in a lower portion of electronics rack 901. Each modular cooling unit 920 may be similar to the modular cooling units depicted in FIG. 4, and described above. The modular cooling unit 920 includes, for example, a liquid-to-liquid heat exchanger for extracting heat from coolant flowing through a system coolant loop 930 of the cooling apparatus and dissipating heat within a facility coolant loop 919, comprising a facility coolant supply line and a facility coolant return line. As one example, the facility coolant supply and return lines couple modular cooling unit 920 to a data center facility cooling supply and return (not shown). Modular cooling unit 920 further includes an appropriately-sized reservoir, pump, and optional filter, for moving liquid-coolant under pressure through system coolant loop 930. In one embodiment, system coolant loop 930 includes a coolant supply manifold 931 and a coolant return manifold 932, which facilitate flow of system coolant through, for example, and air-to-liquid heat exchanger 940 mounted to an air outlet side (or an air inlet side) of electronics rack 901. By way of example, one embodiment of an air-to-liquid heat exchanger 940 is described further below with reference to FIG. 9C.

Figure 9B:
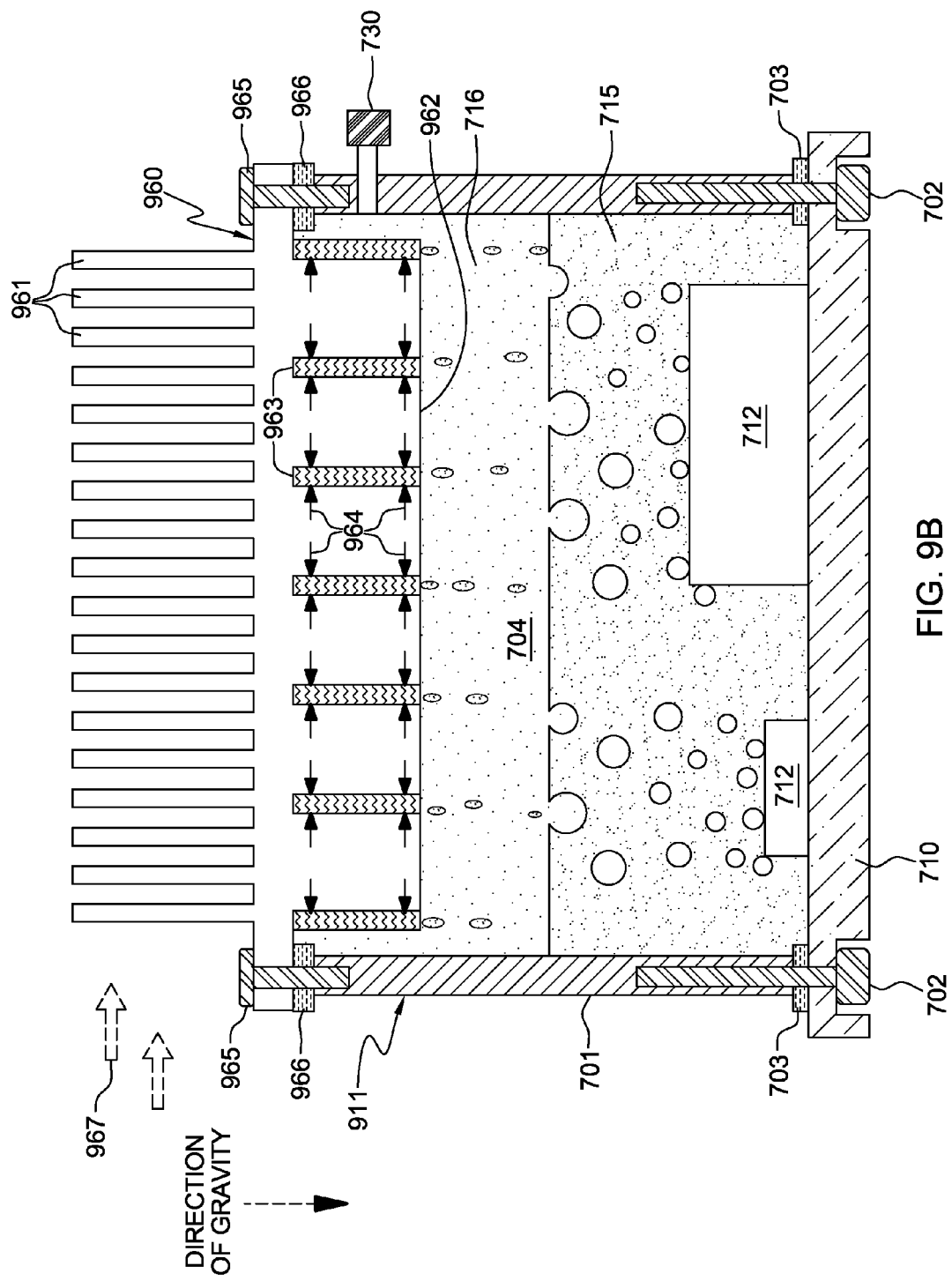
FIG. 9B is a cross-sectional elevational view of one embodiment of an immersion-cooled electronic subsystem employing an air-cooled, wicking vapor-condenser, in accordance with one or more aspects of the present invention.

Referring collectively to FIGS. 9A & 9B, one or more of the electronic components 712 within one or more of the electronic subsystems 910 is immersion-cooled, for example, as explained above in connection with FIGS. 7A-8. In this embodiment, however, the vapor-condenser 960 is an air-cooled, wicking vapor-condenser comprising a plurality of air-cooled fins 961 extending from vapor-condenser 960 in a direction opposite to the plurality of thermally conductive condenser fins 962 of vapor-condenser 960 disposed in vapor region 716 of the compartment 704. Air 967 passes across air-cooled fins 961, transporting heat from vapor-condenser 960 outwards from electronics rack 901 and, in the depicted embodiment of FIG. 9A, across air-to-liquid heat exchanger 940. Air-to-liquid heat exchanger 940 extracts heat from the egressing rack-level airflow 948 before passing into the data center. One or more air-moving devices (such as fans or blowers) 970 may be associated with the electronic subsystem(s) 910 comprising the immersion-cooling enclosure(s) 911 surrounding the one or more heat-generating electronic components 712 to be cooled. Note that the use of air-to-liquid heat exchanger 940 at the air outlet side of electronics rack 901 is optional. Alternatively, the heated air exhausting from electronics rack 901 could exhaust directly into the data center and be cooled by one or more computer room air-conditioning units, such as described above in connection with FIG. 1.

As illustrated in FIG. 9B, multiple wicking components 963 are provided in physical contact with portions of the thermally conductive condenser fins 962 of vapor-condenser 960. These wicking components facilitate drawing of condensed fluid 964 from one or more heat transfer surfaces of the thermally conductive condenser fins, thereby enhancing the heat transfer coefficient of the heat transfer surfaces in a manner such as described above in connection with the wicking components depicted in FIGS. 7A-8. In one embodiment, wicking components 963 may comprise porous strips that are spaced substantially parallel to each other and disposed substantially orthogonal to the parallel-extending, thermally conductive condenser fins 962. Fabrication of the wicking condenser 960 may be similar to that described above in connection with the condenser of FIGS. 7A & 7B.

For example, the porous strips may be fabricated of the above-described porous metal, porous glass, porous ceramics, or porous polymer, and may be press-fitted into periodic grooves (or notches) formed in the plurality of thermally conductive condenser fins. Epoxy or solder or other adhesive material could be used to selectively bond the porous strips to one or more edges of the thermally conductive condenser fins, or to the base of the vapor-condenser. Note that in an alternative embodiment, the wicking components could be positioned at any intersecting angle relative to the plurality of thermally conductive condenser fins, provided the wicking components are in physical contact with at least a portion of one or more of the condenser fins. In operation, the wicking components facilitate drawing condensed fluid from the heat transfer surfaces of the plurality of thermally conductive condenser fins for accumulation within the wicking component(s), and subsequent gravitational return to the dielectric fluid within the fluid-tight compartment.

In the embodiment of FIG. 9B, the air-cooled, wicking vapor-condenser 960 is shown attached via securing means 965 (such as screws) to side walls of the fluid-tight enclosure 911. Sealing gaskets 966 may also be employed to facilitate formation of the fluid-tight compartment 704 comprising the dielectric fluid.

FIG. 9C depicts additional details of one embodiment of an air-to-liquid heat exchanger mounted in a rack door, in accordance with one or more aspects of the invention disclosed herein. As shown at the left portion of the figure, heat exchanger 940 includes one or more tube sections 941, which in one embodiment, may have a plurality of fins projecting therefrom. Depending upon the implementation, tube sections 941 may comprise a single, serpentine channel, or a plurality of discrete heat exchange tube sections coupled together via inlet and outlet plenums 942, 943 disposed at the edge of the rack door configured to hingedly mount to the electronics rack. As shown, the one or more heat exchange tube sections are sized to substantially cover the entire opening 945 in the frame 944 of the door.

In the depicted embodiment, the heat exchange tube sections are fed coolant by coolant inlet plenum 942 and exhaust coolant via coolant outlet plenum 943. Flexible hoses (not shown) may be employed for connecting to hard plumbing disposed near the electronics rack. These hoses would be brought into air-to-liquid heat exchanger 940 adjacent to the hinge axis of the door.

FIG. 9C also illustrates one embodiment of an optional perforated planar surface 946 is illustrated. First and second such perforated planar surfaces 946 could be provided for covering first and second main sides of the heat exchanger. In one embodiment, the perforated planar surfaces comprise metal plates having appropriate air flow openings to allow inlet-to-outlet airflow through the electronics rack to readily pass through the heat exchanger. One embodiment of airflow openings in the perforated planar surfaces is depicted in FIG. 9C. In this embodiment, the perforated planar surface has a plurality of openings disposed throughout the plate. As one example, these openings may comprise hexagon-shaped openings which maximize air flow through the perforated surfaces, while still providing the desired isolation of the heat exchanger.

Each heat exchange tube section may comprise at least one of a continuous tube or multiple tubes connected together to form one continuous serpentine cooling channel. In the embodiment shown, each heat exchange tube section is a continuous tube having a first diameter, and each plenum 942, 943, is a tube having a second diameter, wherein the second diameter is greater than the first diameter. The first and second diameters are chosen to ensure adequate supply of coolant flow through the multiple tube sections. In one embodiment, each heat exchange tube section may align to a respective electronics subsystem of the electronics rack.

Although not shown in FIG. 9C, the heat exchange tube sections further include a plurality of fins extending from tube(s) 941 to facilitate heat transfer, for example, from air exhausted out the back of the electronics rack to coolant flowing through the serpentine cooling channels of the individual heat exchange tube sections. In one embodiment, the plurality of fins comprise aluminum fins extending from the individual tubes, which could be constructed of copper tubing. Further, in one implementation, the fins are brazed to the tubing.

Figure 10A:
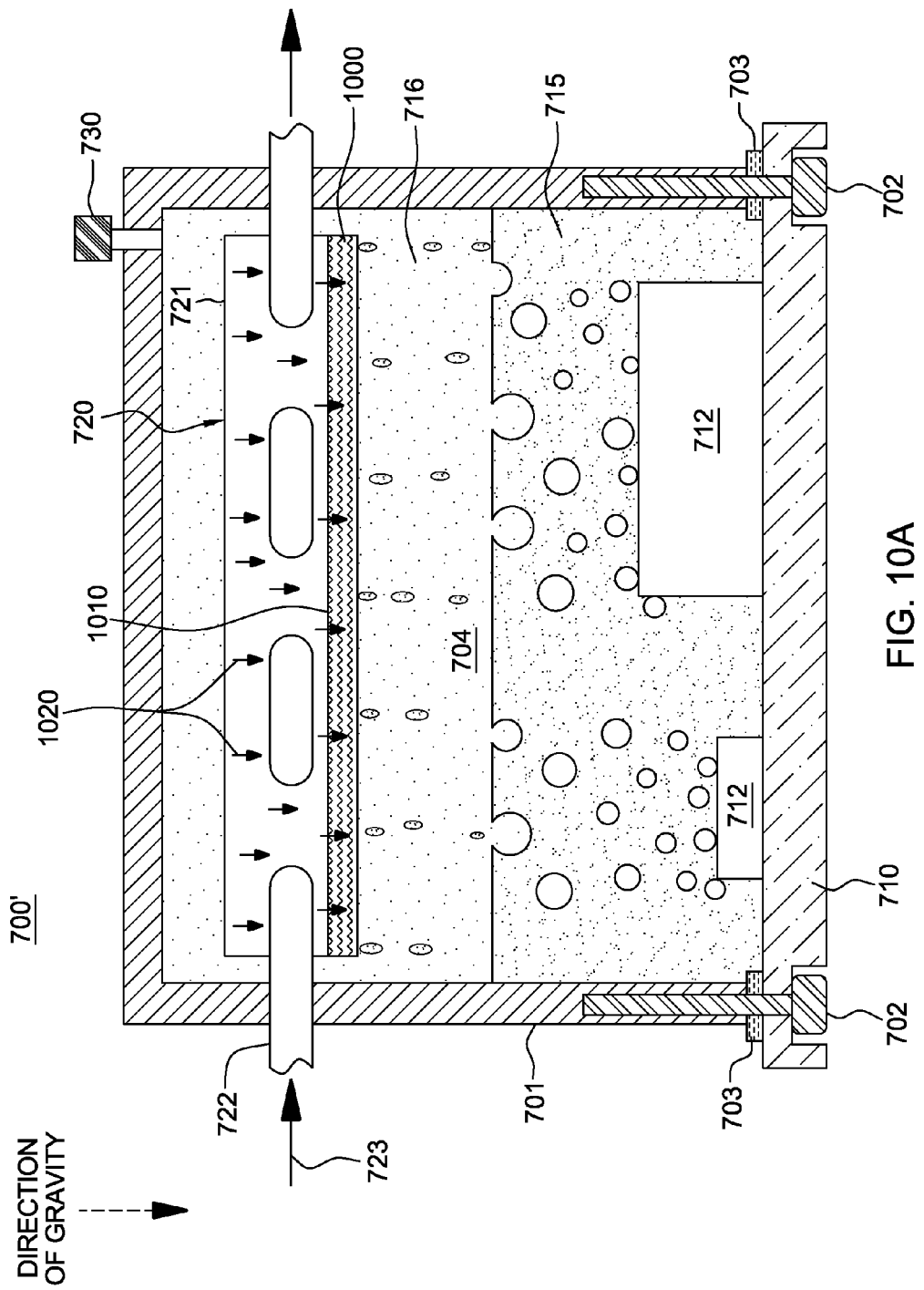
FIG. 10A is a cross-sectional elevational view of an alternate embodiment of an immersion-cooled electronic subsystem of, for example, a liquid-cooled electronics rack such as depicted in FIG. 6A, and employing an alternate embodiment of a wicking vapor-condenser, in accordance with one or more aspects of the present invention.
Figure 10B:
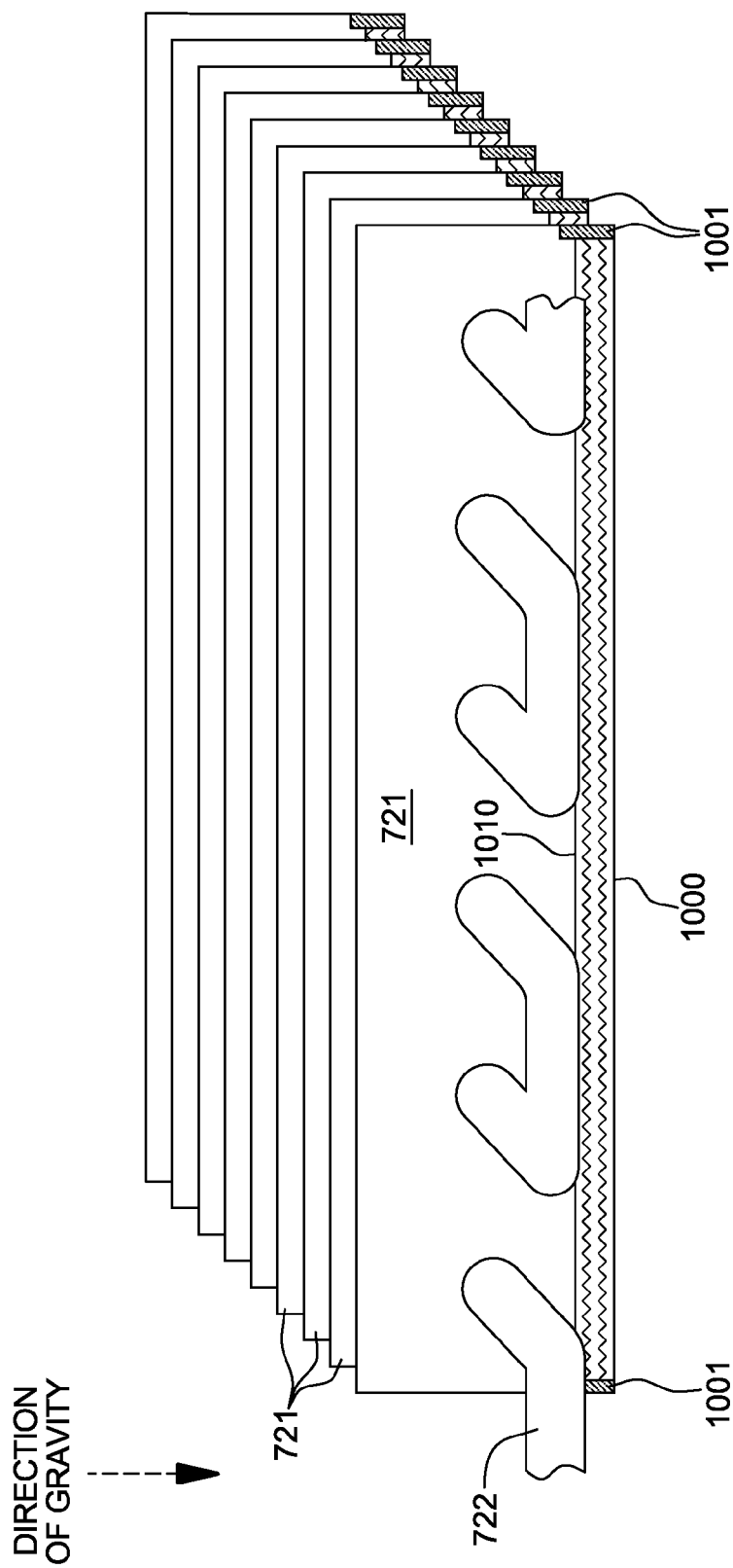
FIG. 10B depicts in greater detail the wicking vapor-condenser of the immersion-cooled electronic subsystem of FIG. 10A, in accordance with one or more aspects of the present invention.

FIGS. 10A & 10B illustrate another embodiment of a cooling apparatus, generally denoted 700', in accordance with one or more aspects of the present invention. In one embodiment, cooling apparatus 700' may be configured to accommodate an electronic subsystem (or node) of an electronics rack, such as described above in connection with FIGS. 6A & 6B. As illustrated, cooling apparatus 700' includes a vapor-condenser 720, such as described above in connection with FIGS. 7A & 7B, and a plurality of wicking components 1000, each attached to an edge (or tip) 1010 of a respective thermally conductive condenser fin 721 of the plurality of thermally conductive condenser fins of the vapor-condenser 720. In one embodiment, edges 1010 are spaced in opposing relation to the one or more electronic components 712 to be cooled. A securing means 1001, such as epoxy or solder, may be employed at the aligned outside edges of the thermally conductive condenser fins 721 and the wicking components 1000, as illustrated in FIG. 10B. Since the edges (or tips) 1010 of the fins (and the regions closest to the tips) do not participate as much in heat transfer as the regions of the fin surfaces closer to the base (see FIG. 8) where the condensing film thickness is smaller, attachment of the porous strips to the edges is not detrimental to the overall performance of the immersion-cooling apparatus. The porous strips facilitate wicking the condensing liquid 1020 towards the tip (or edge) of the thermally conductive condenser fins, and thus reduce the condensate film thickness on the fin surfaces and improve the heat transfer coefficient of the fin surfaces. Attachment of the porous strips directly onto the fins may limit how closely the thermally conductive fins can be placed relative to each other, since the porous strips (or films) may add to the gap (or space) between adjacent thermally conductive condenser fins of the vapor-condenser. The porous strips are attached, in one embodiment, only at the non-wicking edges 1011 using either an epoxy or suitable solder-type material, as shown in FIG. 10B. Porous strips can be similarly applied to either the liquid-cooled, vapor-condenser embodiment of FIGS. 7A-8, or the air-cooled, vapor-condenser embodiment of FIGS. 9A-9B.

Figure 11:
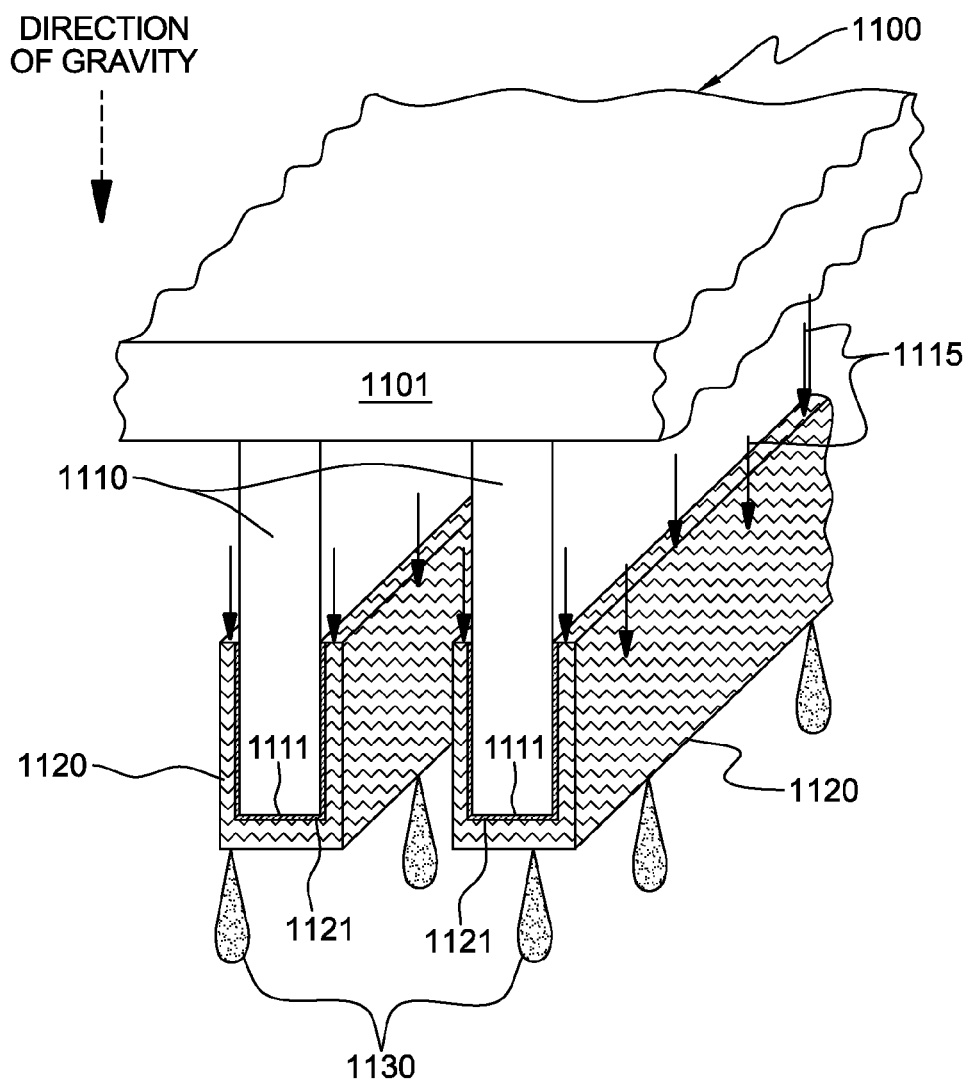
FIG. 11 is a partial depiction of an alternate embodiment of a wicking vapor-condenser for use with an immersion-cooled electronic subsystem (or module), in accordance with one or more aspects of the present invention.

In FIG. 11, a vapor-condenser 1100 is illustrated which may be either air or liquid-cooled, such as described above in connection with FIGS. 7A-9B, and be employed within an immersion-cooling enclosure as described above. In this embodiment, however, the wicking components 1120 wrap around the edges (or tips) 1111 of the thermally conductive condenser fins 1110 that are in opposing relation to the one or more electronic components to be cooled (see FIGS. 7A, 9A & 10A). The wicking components comprise porous strips in physical contact with the heat transfer surfaces of the fins 1110 to facilitate drawing liquid condensate 1115 from the heat transfer surfaces downward towards the edges 1111 of the fins 1110 in the direction of gravity, and the wicking components facilitate return of liquid condensate 1130 to a lower portion of the immersion-cooling enclosure. A securing means 1121, such as epoxy or solder, may be employed at the outside vertical edges of the fins only, so as not to interfere with physical contact of the wicking components with the heat transfer surfaces of the thermally conductive condenser fins. Liquid 1115 that condenses in the lower portion of the fins is wicked into the porous strips (or film), which accumulate the liquid for dripping back into the lower portion of the enclosure. Thermally conductive condenser fins enhanced in this manner could by applied for a variety of condenser-type, immersion-cooled structures, including liquid-cooled and air-cooled vapor-condensers, as well as fin and tube-type condensers, as described herein.

Since the edges 1111 of the fins 1110 do not participate as much in heat transfer as the regions of the fin surfaces closer to the base 1101 where the condensing film 1115 thickness is smaller, attachment of wicking components 1120 to edges 1111 so as to wrap around the edges is not detrimental to the overall performance of the immersion-cooling apparatus.

Those skilled in the art will note from the above-description that provided herein is a novel cooling apparatus and method of immersion-cooling one or more electronic components or subsystems. In particular, condensation performance of the vapor-condenser is enhanced by provision of one or more wicking components disposed within the vapor region of the fluid-tight compartment of the immersion-cooling enclosure, and in physical contact with at least a portion of one or more thermally conductive condenser fins of the vapor-condenser. The wicking component(s) facilitates drawing condensed fluid from at least one surface of the one or more conductive condenser fins and thereby enhances heat transfer across the surface(s) of the one or more thermally conductive condenser fins.

The cooling structures provided herein facilitate preserving the advantages of immersion-cooling over, for example, pumped, single-phase, liquid-cooling, despite limitations on the total heat transfer on the condenser side of a heat sink. Advantages of immersion-cooling include an improved temperature uniformity across the components, a lower required flow rate of the secondary fluid, and the potential for warm water-cooling. The latter advantage would further improve energy efficiency, and enable the use of economizers. In addition, the cooling structures provided herein include wicking components that facilitate wicking condensate from heat transfer surfaces of the vapor-condenser's fins, and thereby improve the heat transfer coefficient of the fins. Wicking of condensate and thinning of liquid film on the fins also allows the fins to be placed closer to each other, and reduces the risk of liquid accumulation between the fins. Increasing fin density further facilitates an increase in total heat transfer area and heat removal by the vapor-condenser. The use of porous wicking components (or layers) further assists with faster liquid accumulation and drainage of the condensate downward towards the heat-generating component(s).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include"

(and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
   a housing at least partially surrounding and forming a fluid-tight compartment about at least one electronic component to be cooled;
   a pool of fluid disposed within the fluid-tight compartment and filling a lower portion thereof, the pool of fluid having an upper surface, wherein the at least one electronic component to be cooled is surrounded by and immersed within the pool of fluid, below the upper surface thereof, and cooled by boiling of the fluid;
   a vapor-condenser comprising a plurality of thermally conductive condenser fins, the plurality of thermally conductive condenser fins extending within the fluid-tight compartment in a vapor region of the fluid-tight compartment in an upper portion thereof, and spaced separate from and disposed above the upper surface of the pool of fluid forming a gap between the upper surface of the pool of fluid and the plurality of thermally conductive condenser fins, the plurality of thermally conductive condenser fins facilitating condensing of vapor in the vapor region, and the return thereof as droplets falling downwards to the pool of fluid in the lower portion of the fluid-tight compartment; and
   at least one wicking component disposed within the vapor region of the fluid-tight compartment separate from and above the pool of fluid and in physical contact with at least one thermally conductive condenser fin of the plurality of thermally conductive condenser fins extending within the fluid-tight compartment, the at least one wicking component extending at least partially in between adjacent thermally conductive condenser fins of the plurality of thermally conductive condenser fins within the vapor region of the fluid-tight compartment and the at least one wicking component, spaced separate from the pool of fluid, drawing condensed fluid from at least one surface of the at least one thermally conductive condenser fin to facilitate return thereof as the droplets falling downwards to the pool of fluid in the lower portion of the fluid-tight compartment.

2. The cooling apparatus of claim 1, wherein the at least one wicking component comprises at least one porous wicking component.

3. The cooling apparatus of claim 2, wherein the at least one porous wicking component comprises at least one porous strip in physical contact with an edge of the at least one thermally conductive condenser fin.

4. The cooling apparatus of claim 1, wherein the cooling apparatus comprises a plurality of separate wicking components disposed within the fluid-tight compartment in the vapor region thereof separate from and above the upper surface of the pool of fluid, the plurality of separate wicking components comprising the at least one wicking component and being in physical contact with the plurality of thermally conductive condenser fins of the vapor-condenser.

5. The cooling apparatus of claim 4, wherein the plurality of separate wicking components comprise a plurality of parallel-extending wicking components, and wherein the plurality of thermally conductive condenser fins comprise a plurality of parallel-extending, thermally conductive condenser fins, and the plurality of parallel-extending wicking components intersect the plurality of parallel-extending, thermally conductive condenser fins, and wherein the at least one wicking component of the plurality of separate wicking components extends in between and physically contacts multiple parallel-extending, thermally conductive condenser fins of the plurality of parallel-extending, thermally conductive condenser fins.

6. The cooling apparatus of claim 5, wherein the plurality of parallel-extending wicking components comprise a plurality of porous strips disposed in between, and substantially perpendicular to and in physical contact with the plurality of parallel-extending, thermally conductive condenser fins.

7. The cooling apparatus of claim 4, wherein the at least one wicking component of the plurality of separate wicking components wraps at least partially around an edge of a respective thermally conductive condenser fin.

8. The cooling apparatus of claim 7, wherein the edge of the respective thermally conductive condenser fin is in spaced, opposing relation to the at least one electronic component to be cooled.

9. The cooling apparatus of claim 1, wherein the at least one wicking component comprises at least one of a porous metal, a porous glass, a porous ceramic, or a porous polymer.

10. A liquid-cooled electronic system comprising:
    an electronics rack comprising at least one electronic component to be cooled; and
    a cooling apparatus immersion-cooling the at least one electronic component, the cooling apparatus comprising:
      a housing at least partially surrounding and forming a fluid-tight compartment about the at least one electronic component to be cooled;
      a pool of fluid disposed within the fluid-tight compartment and filling a lower portion thereof, the pool of fluid having an upper surface, wherein the at least one electronic component to be cooled is surrounded by and immersed within the pool of fluid, below the upper surface thereof, and cooled by boiling of the fluid;
      a vapor-condenser comprising a plurality of thermally conductive condenser fins, the plurality of thermally conductive condenser fins extending within the fluid-tight compartment in a vapor region of the fluid-tight compartment in an upper portion thereof, and spaced separate from and disposed above the upper surface of the pool of fluid forming a gap between the upper surface of the pool of fluid and the plurality of thermally conductive condenser fins, the plurality of thermally conductive condenser fins facilitating condensing of vapor in the vapor region, and the return thereof as droplets falling downwards to the pool of fluid in the lower of the fluid-tight compartment; and at least one wicking component disposed within the vapor region of the fluid-tight compartment separate from and above the pool of fluid and in physical contact with at least one thermally conductive condenser fin of the plurality of thermally conductive condenser tins extending within the fluid-tight compartment, the at least one wicking component extending at least partially in between adjacent thermally conductive condenser fins of the plurality of thermally conductive condenser fins within the vapor region of the fluid-tight compartment and the at least one wicking component, spaced separate from the pool of fluid, drawing condensed fluid from at least one surface of the at least one thermally conductive condenser fin to facilitate return thereof as the droplets falling downwards to the pool of fluid in the lower portion of the fluid-tight compartment.

11. The liquid-cooled electronic system of claim 10, wherein the at least one wicking component comprises at least one porous strip in physical contact with an edge of the at least one thermally conductive condenser fin.

12. The liquid-cooled electronic system of claim 10, wherein the cooling apparatus comprises a plurality of separate wicking components disposed within the fluid-tight compartment in the vapor region thereof separate from and above the upper surface of the pool of fluid, the plurality of separate wicking components comprising the at least one wicking component and being in physical contact with the plurality of thermally conductive condenser fins of the vapor-condenser and facilitating drawing the condensed fluid from the at least one surface of the thermally conductive condenser fins, thereby enhancing heat transfer across the plurality of thermally conductive condenser fins.

13. The liquid-cooled electronic system of claim 12, wherein the plurality of separate wicking components comprise a plurality of parallel-extending wicking components, and wherein the plurality of thermally conductive condenser fins comprise a plurality of parallel-extending, thermally conductive condenser fins, and the plurality of parallel-extending wicking components intersect the plurality of parallel-extending, thermally conductive condenser fins, and wherein the at least one wicking component of the plurality of separate wicking components extends in between and physically contacts multiple parallel-extending, thermally conductive condenser fins of the plurality of parallel-extending, thermally conductive condenser fins.

14. The liquid-cooled electronic system of claim 13, wherein the at least one wicking component of the plurality of separate wicking components wraps at least partially around an edge of the respective thermally conductive condenser fin.

15. The liquid-cooled electronic system of claim 14, wherein the edge of the respective thermally conductive condenser fin is in spaced, opposing relation to the at least one electronic component to be cooled.

16. The liquid-cooled electronic system of claim 10, wherein the at least one wicking component comprises at least one of a porous metal, a porous glass, a porous ceramic, or a porous polymer.

17. The liquid-cooled electronic system of claim 10, wherein the electronics rack comprises an air inlet side and an air outlet side, the air inlet side and the air outlet side respectively enabling ingress and egress of air through the electronics rack, and wherein the liquid-cooled electronic system further comprises an air-to-liquid heat exchanger associated with the air outlet side of the electronics rack, the air-to-liquid heat exchanger facilitating cooling of heated air egressing from the electronics rack, and wherein the vapor-condenser comprises an air-cooled vapor condenser with a plurality of air-cooled fins extending external to the housing within the electronics rack, the plurality of air-cooled fins being cooled by the air passing through the electronics rack between the air inlet side and the air outlet side thereof, wherein heat dissipated to the vapor-condenser is transferred via the air passing through the electronics rack to the air-to-liquid heat exchanger associated with the air outlet side of the electronics rack.

18. A method of facilitating cooling of at least one electronic component, the method comprising:

providing a housing at least partially surrounding and forming a fluid-tight compartment about the at least one electronic component to be cooled;

immersing the at least one electronic component within a pool of dielectric fluid within the fluid-tight compartment to cool the at least one electronic component via boiling of the dielectric fluid, the pool of dielectric fluid filling a lower portion of the fluid-tight compartment, and having an upper surface, the at least one electronic component being surrounded by the pool of dielectric fluid;

providing a vapor-condenser comprising a plurality of thermally conductive condenser fins, the plurality of thermally conductive condenser fins extending into the fluid-tight compartment in a vapor region of the fluid-tight compartment in an upper portion thereof, and spaced separate from and disposed above the upper surface of the pool of dielectric fluid forming a gap between the upper surface of the pool of dielectric fluid and the plurality of thermally conductive condenser fins, the plurality of thermally conductive condenser fins facilitating condensing of vapor in the vapor region, and the return thereof as droplets falling downwards to the pool of fluid in the lower portion of the fluid-tight compartment; and providing at least one wicking component disposed within the vapor region of the fluid-tight compartment separate from and above the pool of dielectric fluid and in physical contact with at least one thermally conductive condenser fin of the plurality of thermally conductive condenser fins extending within the fluid-tight compartment, the at least one wicking component extending at least partially in between adjacent thermally conductive condenser fins of the plurality of thermally conductive condenser fins within the vapor region of the fluid-tight compartment and the at least one wicking component, spaced separate from the pool of dielectric fluid, drawing condensed fluid from at least one surface of the at least one thermally conductive condenser fin to facilitate return thereof as the droplets, falling downwards to the pool of fluid in the lower portion of the fluid-tight compartment.

* * * * *